United States Patent [19]

Li

[11] Patent Number: 5,854,974
[45] Date of Patent: Dec. 29, 1998

[54] COMPENSATED RING MIXERS

[75] Inventor: Xiaohui Li, San Jose, Calif.

[73] Assignee: Watkins Johnson Company, Palo Alto, Calif.

[21] Appl. No.: 420,249

[22] Filed: Apr. 11, 1995

[51] Int. Cl.⁶ .................................................. H04B 1/26
[52] U.S. Cl. .......................................... 455/330; 455/326
[58] Field of Search .................................. 455/313, 317, 455/318, 319, 320, 323, 325, 326, 330, 333, 331; 327/355, 356, 113, 361

[56] References Cited

U.S. PATENT DOCUMENTS

| | | | |
|---|---|---|---|
| 4,063,176 | 12/1977 | Milligan et al. | 455/331 |
| 5,140,705 | 8/1992 | Kosuga | 455/319 |
| 5,265,269 | 11/1993 | Staudinger et al. | 455/333 |

FOREIGN PATENT DOCUMENTS

| | | | |
|---|---|---|---|
| 55-68706 | 5/1980 | Japan | 455/330 |
| 2-198207 | 8/1990 | Japan | 455/326 |
| 1177878 | 9/1985 | U.S.S.R. | 455/331 |

OTHER PUBLICATIONS

RF and Microwave Designer's Handbook, Watkins–Johnson Co., 1993–1994, pp. 504–510, 766–776.

*Primary Examiner*—Nguyen Vo
*Attorney, Agent, or Firm*—Flehr Hohbach Test Albritton & Herbert LLP

[57] ABSTRACT

A compensated mixer including a radio frequency (RF) balun through which RF signals are transferred, and a local oscillator (LO) balun for receiving an LO signal. In an exemplary implementation the mixer further includes a diode ring quad circuit for mixing RF signals received by the RF balun with the LO signal received by the LO balun. During operation the diode ring quad circuit develops, between first and second nodes therein, a capacitive reactance arising from switching at the LO frequency. The mixer further includes a compensation inductor, connected between the first and second nodes, for cancelling the effect of the capacitive reactance at the LO signal frequency.

39 Claims, 3 Drawing Sheets

COMPENSATED RING MIXERS

BACKGROUND OF THE INVENTION

1. Field of the Invention

This invention relates generally to radio frequency communication devices and more specifically to mixers having high third order intercepts.

2. Description of the Prior Art

The dynamic range of many prior art microwave front-ends is controlled by the single and two-tone intermodulation levels of a Schottky diode mixer. (S. Weiner, D. Neuf, S. Spohrer, "2 to 8 GHZ Double Balanced MESFET Mixer With +30 dBm Input 3rd Order Intercept," 1988 *IEEE MTT-S Digest*, pp.1097–1099.) A typical Schottky mixer obtains third order intercept points approximately equal to the local oscillator (LO) power minus the conversion loss plus 10-dB, wherein third-order two-tone intercept points are commonly used as a measure of a figure of merit for a mixer. The popular diode-ring double-balanced mixer often requires the LO power to exceed the signal compression level by 6-dB. Trade-offs between LO power levels and third order intercept and one dB compression points are generally necessary, even in multiple diode schemes attempting to improve isolation, bandwidth, and single-tone intermodulation levels. Low distortion mixing is known to be possible with small amounts of LO power when an unbiased channel of a GaAs MESFET is used as the mixing element. (See, Stephen A. Maas, "A GaAs MESFET Balanced Mixer With Very Low Intermodulation," 1987 *IEEE MTT-S Digest*, pp.895–896.).

In quad-ring demodulator/mixer devices, the switching action of the four ring-connected diode or FET switching elements effects the desired mixing function. The switching elements act, essentially, as a pair of switches reversing the phase of a signal at a rate determined by the LO frequency. The switching elements exhibit a finite on-resistance that is expressed as a conversion efficiency loss. The loss results from the channel resistance of the switching elements relative to both the signal and IF impedances, and from signal conversion to unwanted frequencies. The switching elements may also manifest a parasitic capacitance tending to introduce signal distortion and otherwise adversely affect mixer performance.

OBJECTS OF THE INVENTION

It is therefore an object of this invention to produce a radio frequency mixer characterized by low overall signal distortion.

It is a further object of this invention to providing a technique for improving the third order intercept point of radio frequency mixers in a manner which does not adversely affect other aspects of mixer operation.

SUMMARY OF THE INVENTION

In summary, the present invention is directed to a novel compensated mixer including an RF balun coupled to an RF port, and an LO balun for receiving an LO signal. In an exemplary embodiment the mixer further includes a diode ring quad circuit for mixing an RF signal applied to the RF port with the LO signal. During the mixing process, the diode ring quad circuit develops a capacitive reactance between first and second nodes as a result of switching at the LO frequency. A compensation inductor is connected between the first and second nodes, and becomes resonant at the LO signal frequency with the capacitive reactance. In this way the capacitive reactance exhibited by the diode ring quad is cancelled by the compensation inductor, thereby preventing from adversely affecting mixer performance.

A specific advantage of the present invention is that the compensation inductor enables an improved third order two tone intercept point to be achieved without degrading RF conversion efficiency.

These and other objects and advantages of this invention will no doubt become obvious to those of ordinary skill in the art after having read the following detailed description of the preferred embodiments which are illustrated in the various drawing figures.

IN THE DRAWINGS

FIG. 1 schematically illustrates an exemplary embodiment of a ring quad mixer of the present invention.

Figure 3:
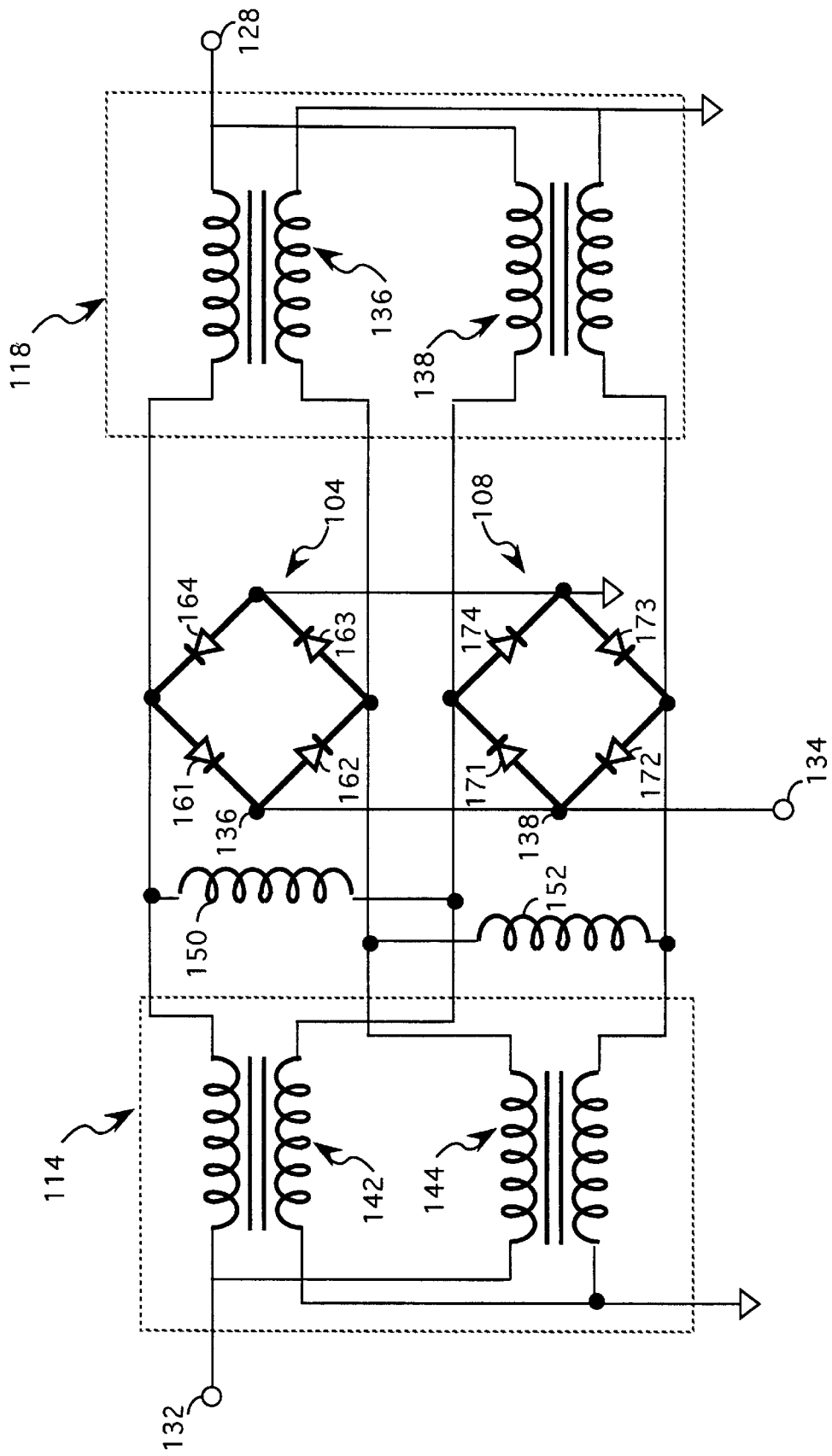

FIG. 3 schematically illustrates an exemplary embodiment of a dual ring quad mixer of the present invention.

DETAILED DESCRIPTION OF THE PREFERRED EMBODIMENTS

Figure 1:
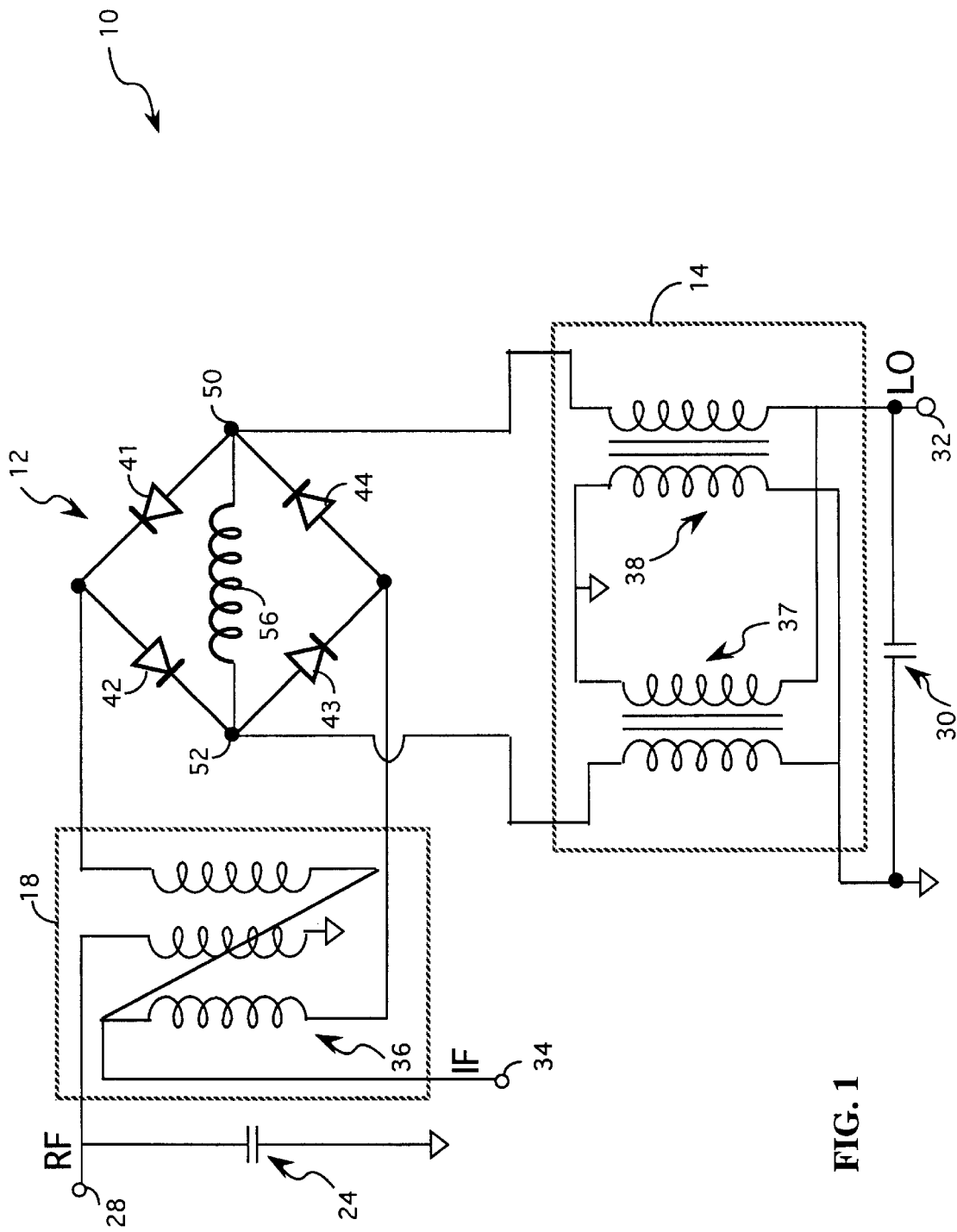

FIG. 1 schematically illustrates an exemplary embodiment of a ring quad mixer 10 of the present invention. The mixer 10 is comprised a diode ring quad 12, to which are coupled a local oscillator (LO) balun 14, and a radio frequency (RF) balun 18. During operation of the mixer 10 as a frequency downconverter, an RF signal is applied across capacitor 24 between signal ground and an RF input 28, an LO signal is applied across capacitor 30 between LO port 32 and signal ground, and an intermediate frequency (IF) output is coupled from an IF port 34 provided by the RF balun 18. When the mixer 10 is operating as a frequency upconverter, the roles of the RF and IF ports 28 and 34 are interchanged.

In the exemplary embodiment of FIG. 1 the RF balun 18 is realized using an RF transformer 36, which is center-tapped to provide the IF port 34. The LO balun 14 includes first and second transformers 37 and 38 for providing, to the diode ring quad 12, the LO signal applied to the LO port 32. It is noted that other types of RF and LO baluns may substituted for those depicted in FIG. 1 without departing from the scope of the present invention.

The diode ring quad 12 includes a set of four switching elements, which in FIG. 1 are realized as first, second, third and fourth diodes 41–44. The diodes 41–44 are serially connected in a ring configuration; that is, the output of each of the diodes 41–44 is coupled to the input of another of the diodes 41–44. During those half-cycles of the applied LO signal for which the voltage at mixer node 50 exceeds the voltage at mixer node 52, diodes 41 and 42 are turned on and diodes 43 and 44 are turned off. Similarly, during the remaining half-cycles of the LO signal the diodes 43 and 44 are turned on and the diodes 41 and 42 are turned off.

The relative phase angle of the signals at the IF port 34 will depend on whether the first and second diodes 41 and 42, or the third and fourth diodes 43 and 44, are forward-biased. That is, if the diodes 41 and 42 are forward-biased, then diodes 43 and 44 must be reverse-biased, and vice versa. The LO signal applied at the LO port 32 is therefore caused to beat against the RF signal applied at the RF port 28, with the products (RF, LO, RF−LO, and RF+LO) appearing at the IF port 34. (The RF and LO product terms are considerably suppressed by virtue of the balanced topology and are therefore insignificant.)

As is discussed further below, during mixer operation a parasitic capacitive reactance develops between the mixer nodes due to the junction capacitance inherent within the diodes 41–44. This capacitive reactance, which varies as a function of the frequency of the applied LO signal, has been found to have deleterious effects on the third-order intercept point of the mixer 10.

In accordance with the invention, a compensation element comprising a compensation inductor 56 is connected between the mixer nodes 50 and 52 for the purpose of effectively eliminating this parasitic capacitive reactance. The inductive reactance of the compensation inductor 56 is selected such that it resonates with the parasitic capacitive reactance at the frequency of the applied LO signal. This improves the mixer third order intercept point by preventing the junction capacitance of the diodes 41–44 from introducing nonlinearity during mixing at the frequency of the LO signal.

Figure 2A:
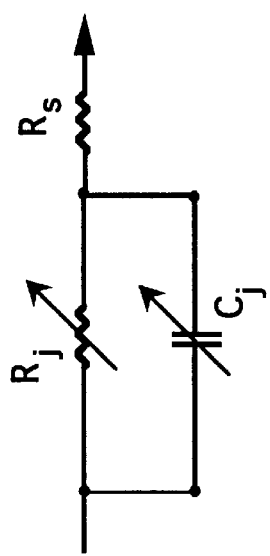
FIG. 2A shows an equivalent circuit representation of one of the diodes included in the ring quad mixer of FIG. 1.

Turning now to FIG. 2A, there is shown an equivalent circuit representative of each of the diodes 41–44. Each diode 41–44 may be characterized as a series resistance ($R_s$), connected in series with the parallel connection of a junction resistance ($R_j$) and junction capacitance ($C_j$). It is the aggregate parasitic capacitive reactance of the diode ring quad 12, to which the junction capacitance ($C_j$) of diode 41–44 contributes, which the compensation inductor 56 is designed to neutralize.

Figure 2B:
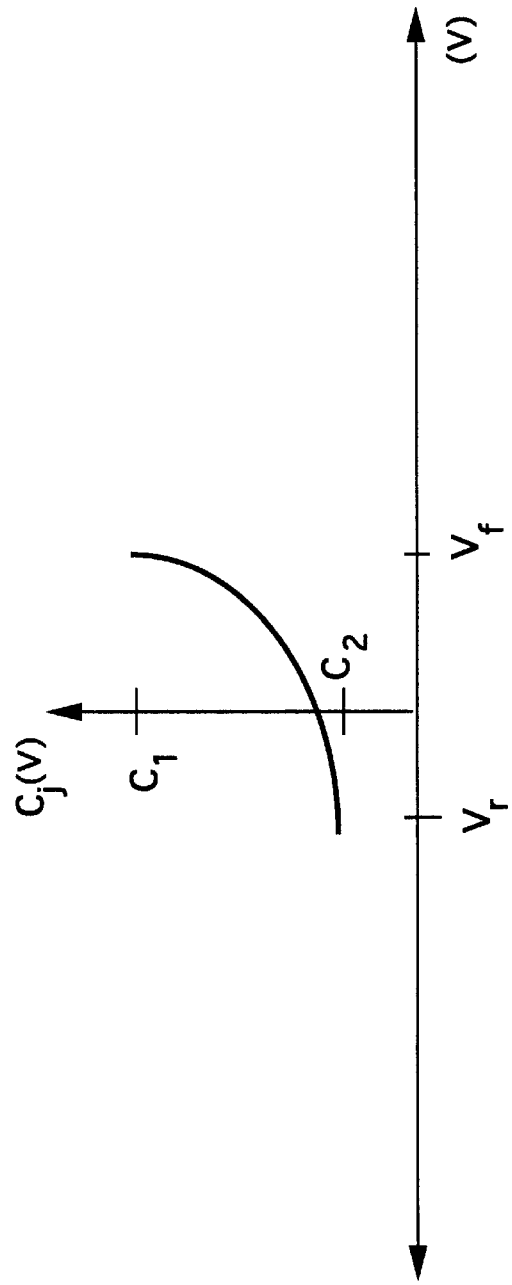
FIG. 2B depicts variation in the junction capacitance ($C_j$) associated with a ring quad diode as a function of the LO signal voltage (V) applied thereto.

FIG. 2B depicts an exemplary variation in the junction capacitance ($C_j$) as a function of the LO signal voltage (V) across a given diode 41–44. In FIG. 2B, it is assumed that the LO signal voltage varies from a maximum forward-bias voltage of $V_f$ to a maximum reverse-bias voltage of $V_r$. At a forward-bias voltage of $V_f$ the junction capacitance is equivalent to $C_1$, and at a reverse-bias voltage of $V_r$ the junction capacitance is equivalent to $C_2$.

When the applied LO signal voltage causes either the first and second diodes 41 and 42, or the third and fourth diodes 43 and 44, to become forward-biased (i.e., $>V_f$), the impedance between terminals 50 and 52 approximates a short circuit. Conversely, when the applied LO signal voltage is such that the voltage across each of the diodes 41–44 is between $V_r$ and $V_f$, then the aggregate parasitic capacitive reactance ($C_p$) between terminals 50 and 52 may be determined by reference to FIG. 2B. In accordance with the invention, the inductive reactance ($L_c$) of the compensation inductor 56 is selected to cancel the effect of $C_p$, and thereby improve mixer linearity.

The inductive reactance $L_c$ necessary to resonate at the LO frequency with the estimated value of $C_p$ may be obtained from the following expression:

$$f_{LO} = \frac{1}{2\pi\sqrt{L_c C_p}}$$

It should be noted that when commercially available inductors are used to realize the compensation inductor 56, any stray capacitance inherent therein may be accounted for through appropriate adjustment of the value of $C_p$.

One feature of the present invention that the compensation inductor 56 improves the third order intercept point of the mixer 10 without adversely affecting other RF and IF operating characteristics, such as RF conversion efficiency. This is achieved by connecting the inductor 56 between the internal mixer nodes 50 and 52, which are at signal ground with respect to the RF signal port 28. Accordingly, the compensation inductor 56 is precluded from introducing distortion into RF signals coupled from the mixer 10.

FIG. 3 schematically illustrates an exemplary embodiment of a dual ring quad mixer 10 of the present invention. The mixer 100 is comprised of first and second diode ring quads 104 and 108, to which are coupled a local oscillator (LO) balun 114, and a radio frequency (RF) balun 118. During operation of the mixer 100 as a frequency downconverter, an RF signal is applied at an RF input 128, and an LO signal is applied at LO port 132. The resultant intermediate frequency (IF) output is coupled from an IF port 134, which is connected to first and second internal nodes 137 and 139 of the first and second diode ring quads 104 and 108, respectively. When the mixer 100 is operating as a frequency upconverter, the roles of the RF and IF ports 128 and 134 are interchanged. That is, an IF input signal is applied via IF port 134 to the first and second diode ring quads 104 and 108, and the resultant RF output signal is coupled from the RF port 128.

In FIG. 3, the RF balun 118 is comprised of first and second RF transformers 137 and 139 which are respectively connected to the ring quad devices 104 and 108. Similarly, the LO balun 114 includes first and second LO transformers 142 and 144 cross-coupled to the ring quad devices 104 and 108.

In the dual-ring implementation of FIG. 3, first and second compensation inductors 150 and 152 serve to compensate for the parasitic capacitive reactance developed by the diode switching elements within the first and second diode ring quads 104 and 108. It is observed that for one-half of each period of the LO signal applied at LO port 132, a first diode 161 within the first diode ring quad 104 and a first diode 171 within the second diode ring quad 108 will be turned on. In addition, a fourth diode 164 within the first diode ring quad 104 and a fourth diode 174 within the second diode ring quad 108 will be turned off. During the other one-half of each LO signal period, the first diodes 161, 171 are turned off and the fourth diodes 164, 174 are turned on.

In accordance with the invention, the first compensation inductor 150 is selected to provide an inductive reactance resonant with the average parasitic capacitive reactance developed by the first diodes 161, 171 in conjunction with the fourth diodes 164, 174 at the LO signal frequency.

In like manner, for one-half of each period of the LO signal applied at LO port 132, a second diode 162 within the first diode ring quad 104 and a second diode 172 within the second diode ring quad 108 will be turned on. During this time a third diode 163 within the first diode ring quad 104 and a third diode 173 within the second diode ring quad 108 will be turned off. During the other one-half of each LO signal period, the second diodes 162, 172 are turned off and the third diodes 163, 173 are turned on. Over each LO signal period, an average parasitic capacitive reactance arises from the set of diodes comprised of the second diodes 162, 172 and the third diodes 163, 173. By selecting the value of the second compensation inductor 152 such that it provides an inductive reactance at the LO signal frequency resonant with this average capacitive reactance, the nonlinearity which would otherwise be engendered is substantially eliminated.

Although this invention has been described in terms of the presently preferred embodiments, it is to be understood that the disclosure is not to be interpreted as limiting. Various alterations and modifications will no doubt become apparent to those skilled in the art after having read the above disclosure. For example, in alternate embodiments appropriately connected transistor devices may be used as switching elements in lieu of the diode ring quads described herein. Accordingly, it is intended that the appended claims be interpreted as covering all alterations and modifications as fall within the true spirit and scope of the invention.

What is claimed is:

1. A mixer, comprising:

an input port having first and second input port terminals for receiving a first input signal and a second input signal 180-degrees phase-shifted from said first input signal;

a switching port having first and second switching terminals for receiving a first switching signal of a predetermined switching frequency and a second switching signal having said same predetermined switching frequency and phase-shifted 180-degrees from said first switching signal;

a switching ring receiving and mixing said first and second input signals with said out-of-phase first and second switching signals, said switching ring comprising a first pair and a second pair of serially connected switching elements, each of which pair of switching elements separately exhibiting time- and voltage-varying first and second parasitic capacitive reactances $C_{p1}(V)$ and $C_{p2}(V)$ that vary monotonically as a function of switching signal phase and voltage at said switching frequency;

said first pair of switching elements being coupled between said first and second switching terminals, said second pair of switching elements being coupled in parallel combination with said first pair between said first and second switching terminals but being coupled with opposite polarity as compared to the coupling of said first pair, and said first and second switching signals are applied at said first and second switching terminals having 180 degree opposite phases so that as a capacitive reactance increases in one pair of said switching elements with a change in switching signal voltage there is a decrease in capacitive reactance in the other pair of said switching elements with said same change in switching signal voltage between said first and second mixer switching terminals so that the effective capacitive reactance formed by the parallel combination of said first and second time- and voltage-varying capacitances Cp1 and Cp2 is the sum of said first and second parasitic capacitances such that $C_p = C_{p1} + C_{p2}$ so that the variation in the capacitive reactance across said first and second switching terminals is less than the variation in capacitive reactance of either of said first and second switching elements separately over the same switching voltage range and over all switching signal phases; and a compensation element coupled to said switching ring across said mixer first and second switching terminals, said mixer switching terminals being at virtual signal ground with respect to said first and second input port terminals, said compensation element including an inductive reactive component having a predetermined inductance value selected so that said compensation element becomes resonant at said switching frequency with an average value of said effective capacitive reactance $C_p$ over said switching voltage range so that said time- and voltage-varying capacitive reactances of each of said first pair and said second pair of switching elements partially self-compensate as switching voltage changes to reduce the variation in said effective capacitive reactance and any remaining uncompensated capacitive reactance is resonated out by said compensating element at all switching frequency signal phases and switching signal voltages;

said coupling of said compensation element between said switching terminals at virtual signal ground with respect to said first and second input port terminals substantially precluding said compensation element from introducing distortion into signals coupled with said mixer;

said compensation element providing a mixer having reduced nonlinearity distortion that would otherwise result from uncompensated capacitive reactance, as compared to an uncompensated mixer.

2. The mixer of claim 1, wherein said compensation element comprises an inductor having an inductive reactance $L_c$ selected in accordance with said effective average capacitive reactance at the switching frequency $f_{LO}$ such that:

$$L_c = 1/\{C_p \times (2\pi f_{LO})^2\}$$

3. The mixer of claim 1, wherein said switching ring includes:

a first switching element having a first switching element input terminal and a first switching element output terminal, a second switching element having a second switching element input terminal and a second switching element output terminal, said second switching element input terminal being connected to said first switching element output terminal, a third switching element having a third switching element input terminal and a third switching element output terminal, said third switching element input terminal being connected to said second switching element output terminal, and a fourth switching element having a fourth switching element input terminal and a fourth switching element output terminal, said fourth switching element input terminal being connected to said third switching element output terminal and said fourth switching element output terminal being connected to said first switching element input terminal.

4. The mixer of claim 3, further including an RF balun configured to receive an external RF signal and generating said first input signal and said 180-degree phase-shifted second input signal and impressing said first input signal at said first switching element input terminal and said second input signal at said third switching element input terminal.

5. The mixer of claim 4, further comprising an LO balun for receiving an external LO signal and for generating said first switching signal and said 180-degree phase shifted second switching signal;

said LO balun coupled to said first and second switching terminals for impressing said first and second switching signals between said second input terminal and said fourth input terminal of said second and fourth switching elements respectively.

6. The mixer of claim 4, wherein said RF balun includes means for providing an IF signal port.

7. The mixer of claim 1, wherein said switching ring comprises a ring quad arrangement having first, second, third and fourth diodes, each of said diodes being characterized by a diode parasitic capacitance $D_{Di}$ contributing to said capacitive reactance $C_p$.

8. The mixer of claim 7, wherein said compensation element comprises an inductor having an inductive reactance value $L_c$ selected in accordance with an effective capacitance $C_p$ formed from said parasitic capacitances of said first $C_{D1}$, second $C_{D2}$, third $C_{D3}$, and fourth $C_{D4}$ diodes satisfying the relationships:

$$C_p = a_1 \frac{C_{D1} \times C_{D2}}{C_{D1} + C_{D2}} + a_2 \frac{C_{D3} \times C_{D4}}{C_{D3} + C_{D4}}$$

where $a_1$ and $a_2$ are proportionality constants, and $$L_c = 1/\{C_p \times (2\pi f_{LO})^2\}$$

where $f_{LO}$ is the frequency of said first and second switching signals.

9. The mixer of claim 1, wherein said input port is adapted to receive an intermediate frequency (IF) signal.

10. The mixer of claim 1, wherein said input port is adapted to receive a radio frequency (RF) signal.

11. A mixer, comprising:
an RF balun coupled to an RF port having first and second RF terminals for receiving an RF signal;
an LO balun for receiving an LO signal of an LO frequency and for generating a first switching signal at said LO frequency and a second switching signal at the LO frequency but out-of-phase with said first switching signal;
switching ring means for mixing said RF signal with said LO signal, said switching ring means comprising a plurality of switching elements each exhibiting individual switching element capacitive reactances varying as a function of switching signal phase and amplitude at said LO frequency, said switching elements connected between a first node and a second node so that as the capacitive reactance of one or more of said plurality of switching elements increases in response to a first switching signal applied thereto, the capacitive reactance of another one or other ones of said plurality of switching elements decreases in response to a second switching signal applied thereto so that the variation in the resultant capacitive reactance presented between said first and second nodes is substantially constant; and
a compensation element having an inductive reactance value selected to resonate with said resultant substantially constant capacitive reactance and connected between said first and second nodes, said first and second nodes being at virtual signal ground with respect to said first and second RF port terminals, said compensation element becoming resonant at the frequency of said LO signal with said resultant substantially constant capacitive reactance so as to cancel said resultant substantially constant capacitive reactance and thereby prevent said resultant substantially constant capacitive reactance from adversely degrading mixer performance.

12. The mixer of claim 11, wherein said compensation element comprises an inductor having an inductive reactance $L_c$ selected in accordance with said capacitive reactance $C_p$ at the LO frequency $f_{LO}$ such that:

$$L_c = 1/\{C_p \times (2\pi f_{LO})^2\}$$

13. The mixer of claim 11, wherein said switching ring means comprises a ring quad arrangement of having first D1, second D2, third D3 and fourth D4 diodes as said switching elements, each of said diodes being characterized by a respective diode junction parasitic capacitance $C_{D1}$, $C_{D2}$, $C_{D3}$, and $C_{D4}$ contributing to said resultant capacitive reactance $C_p$, and wherein said resultant capacitive reactance $C_p$ is related to said inductive reactance value of said compensation element having an inductance value $L_c$ by the relationships:

$$C_p = a_1 \frac{C_{D1} \times C_{D2}}{C_{D1} + C_{D2}} + a_2 \frac{C_{D3} \times C_{D4}}{C_{D3} + C_{D4}}$$

where $a_1$ and $a_2$ are proportionality constants, and $$L_c = 1/\{C_p \times (2\pi f_{LO})^2\}.$$

14. A dual ring mixer, comprising:
an RF balun coupled to an RF port;
an LO balun for receiving an Lo signal of an LO frequency;
a first ring quad mixer coupled to said RF balun and to said LO balun;
a second ring quad mixer coupled to said RF balun, to said LO balun, and to said first ring quad mixer;
said first and second ring quad mixers each include a set of four switching elements connected between a corresponding set of four internal nodes; and
inductive compensation means for compensating for capacitive reactance developed within said first and second ring quad mixers during switching operation at said LO frequency;
said inductive compensation means includes:
a first inductor connected between a first of said four internal nodes of said first ring quad mixer and a first of said four internal nodes of said second ring quad mixer, and
a second inductor connected between a second of said four internal nodes of said first ring quad mixer and a second of said four internal nodes of said second ring quad mixer.

15. The dual ring mixer of claim 14, wherein said LO balun includes a LO input port for receiving an external LO signal, and first, second, third, and fourth LO balun output terminals, said first inductor being connected across said first and third terminals having the same amplitude but opposite phase, and said second inductor being connected across said second and fourth terminals having the same amplitude but opposite phase.

16. In a mixer including an input port for receiving an input signal, and a switching signal port having first and second switching terminals for receiving a first switching signal of a predetermined switching frequency $f_s$ and a second switching signal having the same switching frequency $f_s$ but phase-shifted 180 degrees relative to said first switching signal, and at least first and second switching elements, a method of reducing distortion caused by parasitic capacitive reactance in said switching elements by compensating for said parasitic capacitive reactance in said mixer comprising the steps of:
providing a ring mixer circuit for mixing said input signal with said switching signals, said ring mixer circuit including said first and second switching elements connected in parallel between said first and second switching terminals;

compensating for a switching-voltage varying component of said parasitic capacitive reactance by providing said first switching element exhibiting a switching voltage-varying capacitive reactance that increases as the switching signal voltage measured from said first to said second switching terminal increases, and by providing said second switching element exhibiting a switching voltage-varying capacitive reactance that decreases as the switching signal voltage measured from said first to said second switching terminal increases, such that the resultant switching voltage-varying parasitic capacitance exhibited between said first and second switching terminals has a smaller variation across an operable range of switching signal voltage than the variation in parasitic capacitance of either of said first or second switching elements individually exhibits, and said resultant switching voltage-varying parasitic capacitance has an average capacitive reactance value over said operable range of switching voltage;

compensating for a switching signal phase varying component of said parasitic capacitive reactance by coupling a compensation element to said ring mixer circuit in parallel with said first and second switching elements between said first and second switching terminals, selecting said compensation element to have an inductive reactive component with an inductive value $L_C$ selected to become resonant with said average capacitive reactance at said switching frequency so that said parasitic capacitive reactance is resonated out of said mixer by said compensation element.

17. The method in claim 16, wherein said inductive reactive component $L_c$ is selected in accordance with said capacitive reactance $C_p$ at said switching frequency $f_s$ such that:

$$L_c = 1/\{C_p \times (2\pi f_s)^2\}.$$

18. The method of claim 16, wherein said ring mixer circuit comprises a ring quad arrangement of having first D1, second D2, third D3, and fourth D4 diodes, each of said diodes being characterized by a diode parasitic capacitance $C_{Di}$ contributing to said capacitive reactance $C_p$, and wherein said inductive reactive component of said compensation element is selected to have an inductance value $L_c$ defined by the relationships:

$$C_p = a_1 \frac{C_{D1} \times C_{D2}}{C_{D1} + C_{D2}} + a_2 \frac{C_{D3} \times C_{D4}}{C_{D3} + C_{D4}}$$

where $a_1$ and $a_2$ are proportionality constants, and $$L_c = 1/\{C_p \times (2\pi f_{LO})^2\}.$$

19. In a mixer including an RF balun coupled to an RF port for receiving an RF signal and an LO balun for receiving an LO signal at a LO frequency $f_{LO}$, a method of impedance compensation comprising the steps of:

providing a ring mixer circuit for mixing said RF signal with said LO signal, said ring mixer circuit including first and second switching elements connected in parallel combination between a first and a second switching terminal, each said first and second switching element having a reverse bias voltage and a forward bias voltage and each said first and second switching element individually exhibiting a respective time-varying non-linear capacitive reactance, and said parallel combination exhibiting an effective capacitive reactance $C_p$ that varies insubstantially compared to said time-varying non-linear capacitive reactances over a particular switching signal voltage range defined between said first and second reverse bias voltage and said first and second forward bias voltage between said first and second switching terminals at said LO frequency;

selecting a compensation inductor having an inductance $L_c$ such that said compensation inductor becomes resonant with said effective capacitive reactance $C_p$ at said LO frequency over said particular switching signal voltage range; and connecting said selected compensation inductor between said first and second switching terminals to thereby resonate with and substantially cancel said effective capacitive reactance $C_p$ at said LO signal frequency over said particular switching signal voltage range.

20. The method in claim 19, wherein said compensation inductor has an inductance value $L_c$ selected in accordance with said capacitive reactance $C_p$ at said switching frequency $f_s$ such that:

$$L_c = 1/\{C_p \times (2\pi f_s)^2\}.$$

21. The method of claim 19, wherein said ring mixer circuit comprises a ring quad arrangement, and wherein said first switching element comprises first D1, and second diodes D2, and said second switching element comprises third D3, and fourth D4 diodes, said diodes connected head to tail so that said first and second diode are serially connected to form a first diode pair, said third and fourth diodes are serially connected to form a second pair, and said first pair is connected in parallel with said second pair but with opposite polarity, each of said diodes being characterized by a respective diode parasitic capacitance $C_{D1}$, $C_{D2}$, $C_{D3}$, $C_{D4}$ contributing to said capacitive reactance $C_p$, and wherein said compensation inductor is selected to have an inductance value $L_c$ defined by the relationships:

$$C_p = a_1 \frac{C_{D1} \times C_{D2}}{C_{D1} + C_{D2}} + a_2 \frac{C_{D3} \times C_{D4}}{C_{D3} + C_{D4}}$$

where $a_1$ and $a_2$ are proportionality constants, and $$L_c = 1/\{C_p \times (2\pi f_{LO})^2\}.$$

22. In a mixer including an input port for receiving an input signal, a switching port for receiving a switching signal of a predetermined switching frequency $f_s$, and a ring mixer circuit, comprising a plurality of elements each exhibiting an individual time-varying non-linear capacitive reactance, for mixing said input signal with said switching signal, the improvement comprising:

connecting ones of said plurality of elements so that a capacitive reactance increases exhibited at said switching frequency by a first set of said elements is at least partially canceled by a second set of said elements so that said plurality of elements exhibits a substantially constant switching-signal invariant effective capacitive reactance;

a compensation element coupled to said ring mixer circuit, said compensation element having an inductive reactive component having an inductive reactive value $L_c$ selected such that at said switching frequency said compensation element resonates with said effective capacitive reactance, said mixer thereby substantially canceling said time-varying non-linear capacitive reactances exhibited by said plurality of elements.

23. The improvement to the mixer according to claim 22, wherein said compensation element comprises an inductor having an inductive reactance selected in accordance with said capacitive reactance.

24. The improvement to the mixer according to claim 23, wherein said inductor has an inductance value $L_c$ selected in accordance with said capacitive reactance $C_p$ at said switching frequency $f_s$ such that:

$$L_c = 1/\{C_p \times (2\pi f_s)^2\}.$$

25. The improvement to the mixer according to claim 22, wherein said ring mixer circuit comprises a ring quad arrangement having first D1, second D2, third D3, and fourth D4 diodes, each of said diodes being characterized by having a diode parasitic capacitance $C_{Di}$ contributing to said capacitive reactance $C_p$, and wherein said inductive reactive component is selected to have an inductive reactive value $L_c$ defined by the relationships:

$$C_p = a_1 \frac{C_{D1} \times C_{D2}}{C_{D1} + C_{D2}} + a_2 \frac{C_{D3} \times C_{D4}}{C_{D3} + C_{D4}}$$

where $a_1$ and $a_2$ are proportionality constants, and $$L_c = 1/\{C_p \times (2\pi f_{LO})^2\}.$$

26. A dual ring mixer, comprising:

an RF balun coupled to an RF port for communicating an external RF signal and for generating a first RF input/output signal and a second RF input/output signal corresponding to said first RF input/output signal but 180-degrees out-of-phase with said first RF signal;

a local oscillator (LO) balun for receiving an external LO signal of an LO frequency at a LO input port and for generating first ($LO_1$) and second ($LO_2$) LO switching signals at said LO frequency and third ($LO_3$) and fourth ($LO_4$) switching signals at said LO frequency but 180-degrees out-of-phase with said first and second LO switching signals;

a first switching ring quad comprising first S1, second S2, third S3, and fourth S4 switching elements connected serially in head-to-tail manner;

a second switching ring quad comprising fifth S5, sixth S6, seventh S7, and eighth S8 switching elements connected serially in head-to-tail manner;

each of said switching elements separately exhibiting a capacitive reactance that varies as a function of switching signal phase and amplitude;

said first switching signal connected to a first switching node defined by the connection between said S1 and S2, said second switching signal connected to a second switching node defined by the connection between said S3 and S4, said third switching signal connected to a third switching node defined by the connection between said S5 and S6, and said fourth switching signal connected to a fourth switching node defined by the connection between said S7 and S8;

a fifth node being shared by S2 and S3 and S6 and S7, and a sixth node is shared by the common connection of S1 and S4 and S5 and S8 and providing a second external output/input terminal;

said switching elements being configured so that when the voltage of first switching signal $LO_1$ and second switching signal $LO_2$ increases the capacitive reactances of S1 and S5 and S3 and S7 each increase, when the voltage of first switching signal $LO_1$ and second switching signal $LO_2$ decreases the capacitive reactances of S1 and S5 and S3 and S7 each decrease; and when the voltage of third switching signal $LO_3$ and fourth switching signal $LO_4$ increases the capacitive reactances of S2 and S4 and S6 and S8 each increase, when the voltage of third switching signal $LO_3$ and fourth switching signal $LO_4$ decreases the capacitive reactances of S2 and S4 and S6 and S8 each decrease;

a first effective capacitive reactance resulting from the combination of switching elements coupled between said first and third switching nodes having a capacitive reactance variation as a function of phase and amplitude of the switching signals applied to said first and third switching nodes that is less than the capacitive reactance variation of said switching elements forming said combination, and a second effective capacitive reactance resulting from the combination of switching elements coupled between said second and fourth switching nodes having a capacitive reactance variation as a function of phase and amplitude of the switching signals applied to said second and fourth switching nodes that is less than the capacitive reactance variation of said switching elements forming said combination;

first inductive compensation means connected between said first and third switching nodes including first inductive reactance means having a first selected fixed inductive reactance value selected to resonate with said first effective capacitive reactance between said first and third switching nodes to compensate said first effective capacitive reactance dynamically during operation; and second inductive compensation means connected between said second and fourth switching nodes including second inductive reactance means having a second selected fixed inductive reactance value selected to resonate with said second effective capacitive reactance between said second and fourth switching nodes to compensate said second effective capacitive reactance dynamically during operation;

said switching nodes being at virtual signal ground with respect to said RF port;

said coupling of said first and second inductive compensation means between said switching terminals at virtual signal ground substantially precluding said first and second inductive compensation means from introducing distortion into signals coupled with said mixer;

said mixer having reduced non-linearity distortion resulting from uncompensated capacitive reactance as compared to mixer not providing said first and second inductive compensation means;

said first switching ring quad comprises a first ring quad arrangement having first, second, third and fourth diodes, each of said diodes being characterized by having a diode parasitic capacitance $C_{Di}$;

said second switching ring quad comprises a second ring quad arrangement having fifth, sixth, seventh and eighth diodes, each of said diodes being characterized by having a diode parasitic capacitance $C_{Di}$;

said first and second ring quads being connected to each other and to said RF and LO baluns to define particular conductive paths through said first and second switching ring quads in response to said applied LO switching signals;

each said defined conductive path having a capacitive reactance $C_{pi}$ associated with diodes forming said conductive path;

said first and second inductive compensation means each comprising an inductor connected in parallel with said diodes forming said conductive path and having a inductance value $L_{ci}$ chosen to resonate with said capacitive reactance $C_{pi}$ developed within said diodes forming said particular conductive path;

said inductive inductance value $L_{ci}$ for each conductive path selected in accordance with said capacitive reactance $C_{pi}$ at the LO frequency $f_{LO}$ such that:

$$L_{ci}=1/\{C_{pi}\times(2\pi f_{LO})^2\}.$$

27. A circuit comprising:

a first two terminal port for simultaneously receiving a first switching signal at a switching frequency $f_{sw}$ at a first switching terminal, and a second switching signal having said same switching frequency $f_{sw}$ but at predetermined switching phase difference with respect to said first switching signal at a second switching terminal;

a second two terminal RF port for coupling a first RF signal at a first RF terminal and a second RF signal having a predetermined phase difference with respect to said first RF signal at a second RF terminal;

a first diode D1 having an input terminal and an output terminal and exhibiting a first parasitic capacitive reactance $C_{D1}$ between said input and output terminals;

a second diode D2 having an input terminal and an output terminal and exhibiting a second parasitic capacitive reactance $C_{D2}$ between said input and output terminals;

a third diode D3 having an input terminal and an output terminal and exhibiting a third parasitic capacitive reactance $C_{D3}$ between said input and output terminals;

a fourth diode D4 having an input terminal and an output terminal and exhibiting a fourth parasitic capacitive reactance $C_{D4}$ between said input and output terminals;

said D1 being connected in series with D2 at said second RF terminal, and said D3 being connected in series with D4 at said first RF terminal, and said series combinations of D1 with D2 and D3 with D4 being connected in parallel between said first and said second switching terminals to form a diode ring;

said parasitic capacitive reactance of each of said D1, D2, D3, and D4 having a capacitance reactance value that varies non-linearly as a function of the phase and amplitude of the switching signal voltage between said input and output diode terminals such that: as forward switching signal voltage applied across the combination of D1 with D2 increases, the capacitive reactance $C_{D1}$ and $C_{D2}$ exhibited by said combination increases, and as said applied switching signal voltage decreases, the exhibited capacitive reactance of D1 with D2 decreases; and as forward switching signal voltage applied across the combination of D3 with D4 increases, the capacitive reactance $C_{D3}$ and $C_{D4}$ exhibited by said combination increases, and as said applied switching signal voltage decreases, the exhibited capacitive reactance of D3 with D4 decreases;

said parallel combination of serially connected diode pairs D1 with D2 and D3 with D4 exhibiting a total resultant capacitive reactance $C_{Dtot}$ having a variation with said switching signal voltage increase and decrease that is lower than the variation of any one of said diodes D1, D2, D3, or D4, and substantially independent of applied signal voltage phase and amplitude over a predetermined operating range of said circuit; and inductive compensation means, having an inductive reactance component, connected between said first and said second switching terminals and in parallel with the serially connected D1 with D2 pair and D3 with D4 pair;

said inductive reactive component having an inductive reactance $L_c$ selected to compensate for said total resultant capacitive reactance $C_{Dtot}$ by resonating with said total resultant capacitive reactance $C_{Dtot}$ so that said total resultant capacitive reactance is resonated out of said circuit to thereby dynamically compensate for the effect of the non-linear diode generated parasitic capacitive reactances over said predetermined operating range of said circuit.

28. The circuit in claim 27, wherein said predetermined phase difference is 180-degrees.

29. The circuit in claim 28, wherein said inductive reactive component comprises an inductor.

30. The circuit in claim 29, wherein said total resultant capacitive reactance exhibited by said circuit is approximately given by the relationship:

$$C_p = a_1 \frac{C_{D1} \times C_{D2}}{C_{D1} + C_{D2}} + a_2 \frac{C_{D3} \times C_{D4}}{C_{D3} + C_{D4}}$$

where $a_1$ and $a_2$ are proportionality constants pertaining to the equivalent circuit model of a physical diode device, and wherein said inductive reactance is selected to be $L_c=1/\{C_p\times(2\pi f_{SW})_2\}$, where $f_{SW}$ is the switching signal frequency to thereby resonate with and compensate for said resultant capacitive reactance.

31. The circuit in claim 28, wherein said inductive reactive component consists essentially of an inductor.

32. The circuit of claim 27, wherein said first and said second switching signals are each sinusoidal signals at a local oscillator (LO) signal frequency, wherein said circuit further comprises an intermediate frequency (IF) port for coupling an IF signal, and wherein said circuit is a mixer circuit for mixing a selected one of said RF and IF signals with said LO signals to generate an output.

33. The circuit of claim 27, further comprising an RF balun coupled to said two terminal RF port and configured to accept an external RF signal and generate said first and second RF out-of-phase signals at said first RF input and said second RF input terminals respectively.

34. The circuit of claim 33, further comprising an LO balun for receiving an external LO signal and for generating said first switching signal and said phase shifted second switching signal;

said LO balun coupled to said first and second switching terminals for impressing said switching signals between said first switching terminal and said second switching terminal.

35. The circuit of claim 34, wherein said RF balun includes means for providing an IF signal port.

36. The circuit in claim 27, where said diodes are implemented with transistors.

37. The circuit in claim 27, wherein said circuit operates as a mixer.

38. A dual ring mixer, comprising:

an RF balun coupled to an RF port for communicating an external RF signal and for generating a first RF input/ output signal and a second RF input/output signal corresponding to said first RF input/output signal but 180-degrees out-of-phase with said first RF signal;

a local oscillator (LO) balun for receiving an external LO signal of an LO frequency at a LO input port and for generating first ($LO_1$) and second ($LO_2$) LO switching signals at said LO frequency and third ($LO_3$) and fourth ($LO_4$) switching signals at said LO frequency but 180-degrees out-of-phase with said first and second LO switching signals;

a first switching ring quad comprising first S1, second S2, third S3, and fourth S4 switching elements connected serially in head-to-tail manner to form said first switching ring quad;

a second switching ring quad comprising fifth S5, sixth S6, seventh S7, and eighth S8 switching elements connected serially in head-to-tail manner to form said second switching ring quad;

each of said switching elements separately exhibiting a capacitive reactance that varies as a function of switching signal phase and amplitude;

said first switching signal connected to the first switching node defined by the connection between said S1 and S2, said second switching signal connected to the second switching node defined by the connection between said S3 and S4, said third switching signal connected to the third switching node defined by the connection between said S5 and S6, and said fourth switching signal connected to the fourth switching node defined by the connection between said S7 and S8;

a fifth node being shared by S2 and S3 and S6 and S7, and a sixth node is shared by the common connection of S1 and S4 and S5 and S8 and providing a second external output/input terminal;

said switching elements being configured so that when the voltage of first switching signal $LO_1$ and second switching signal $LO_2$ increases the capacitive reactances of S1 and S5 and S3 and S7 each increase, when the voltage of first switching signal $LO_1$ and second switching signal $LO_2$ decreases the capacitive reactances of S1 and S5 and S3 and S7 each decrease; and when the voltage of third switching signal $LO_3$ and fourth switching signal $LO_4$ increases the capacitive reactances of S2 and S4 and S6 and S8 each increase, when the voltage of third switching signal $LO_3$ and fourth switching signal $LO_4$ decreases the capacitive reactances of S2 and S4 and S6 and S8 each decrease;

a first effective capacitive reactance resulting from the combination of diodes coupled between said first and third switching nodes having a capacitive reactance variation as a function of phase and amplitude of the switching signals applied to said first and third switching nodes that is less than the capacitive reactance variation of said diodes forming said combination, and a second effective capacitive reactance resulting from the combination of diodes coupled between said second and fourth switching nodes having a capacitive reactance variation as a function of phase and amplitude of the switching signals applied to said second and fourth switching nodes that is less than the capacitive reactance variation of said diodes forming said combination;

first inductive compensation means connected between said first and third switching nodes including first inductive reactance means having a first selected fixed inductive reactance value selected to resonate with said first effective capacitive reactance between said first and third switching nodes to compensate said first effective capacitive reactance dynamically during operation; and second inductive compensation means connected between said second and fourth switching nodes including second inductive reactance means having a second selected fixed inductive reactance value selected to resonate with said second effective capacitive reactance between said second and fourth switching nodes to compensate said second effective capacitive reactance dynamically during operation;

said switching nodes being at virtual signal ground with respect to said RF port;

said coupling of said first and second inductive compensation means between said switching terminals at virtual signal ground substantially precluding said first and second inductive compensation means from introducing distortion into signals coupled with said mixer;

said mixer having reduced non-linearity distortion resulting from uncompensated capacitive reactance as compared to mixer not providing said first and second inductive compensation means.

39. The dual ring mixer of claim 38, wherein said switching elements are selected from the group consisting of diodes, and transistors.

* * * * *